(12) United States Patent
Han et al.

(10) Patent No.: US 11,158,589 B2
(45) Date of Patent: Oct. 26, 2021

(54) SEMICONDUCTOR DEVICE AND SEMICONDUCTOR PACKAGE COMPRISING THE SAME

(71) Applicant: SAMSUNG ELECTRONICS CO., LTD., Suwon-si (KR)

(72) Inventors: Seung Hun Han, Hwaseong-si (KR); Yun Rae Cho, Guri-si (KR); Nam Gyu Baek, Suwon-si (KR); Ae Nee Jang, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 3 days.

(21) Appl. No.: 16/532,542

(22) Filed: Aug. 6, 2019

(65) Prior Publication Data
US 2020/0051932 A1    Feb. 13, 2020

(30) Foreign Application Priority Data

Aug. 7, 2018    (KR) .................. 10-2018-0091643

(51) Int. Cl.
*H01L 23/58* (2006.01)
*H01L 23/00* (2006.01)
*H01L 23/31* (2006.01)
*H01L 21/78* (2006.01)

(52) U.S. Cl.
CPC ........ *H01L 23/585* (2013.01); *H01L 23/3171* (2013.01); *H01L 24/13* (2013.01); *H01L 24/16* (2013.01); *H01L 21/78* (2013.01); *H01L 2224/13024* (2013.01); *H01L 2224/16227* (2013.01)

(58) Field of Classification Search
CPC ..... H01L 24/13; H01L 24/16; H01L 23/3114; H01L 23/3171; H01L 23/3157; H01L 23/585; H01L 21/78; H01L 2224/13024; H01L 2224/16227
See application file for complete search history.

(56) References Cited

U.S. PATENT DOCUMENTS

| 7,358,155 B2 | 4/2008 | Ahn et al. |
| 7,582,899 B2 | 9/2009 | Koh et al. |
| 8,513,776 B2 | 8/2013 | Otsuka |

(Continued)

FOREIGN PATENT DOCUMENTS

| JP | 2007189111 A | 7/2007 |
| JP | 2013105919 A | 5/2013 |

*Primary Examiner* — Vongsavanh Sengdara
(74) *Attorney, Agent, or Firm* — Volentine, Whitt & Francos, PLLC

(57) ABSTRACT

A semiconductor device has a semiconductor chip region which contains a semiconductor chip and a first portion of a passivation film covering the semiconductor chip and a scribe line region which contains a second portion of the passivation film connected to the first portion of the passivation film, a first insulating film protruding from a distal end of the second portion of the passivation film, and at least a part of a first wiring. A first portion of the first insulating film is disposed along the distal end of the second portion of the passivation film, a second portion of the first insulating film protrudes laterally beyond the first portion of the first insulating film, and the first wiring protrudes laterally beyond the second portion of the first insulating film.

20 Claims, 14 Drawing Sheets

(56) References Cited

U.S. PATENT DOCUMENTS

| | | | |
|---|---|---|---|
| 8,772,895 B2 | 7/2014 | Lu et al. | |
| 9,748,181 B1 * | 8/2017 | Jackson | H01L 23/53266 |
| 2003/0160303 A1 | 8/2003 | Hirokawa et al. | |
| 2005/0098893 A1 * | 5/2005 | Tsutsue | H01L 23/5226 |
| | | | 257/758 |
| 2005/0269702 A1 * | 12/2005 | Otsuka | H01L 24/03 |
| | | | 257/750 |
| 2008/0014735 A1 * | 1/2008 | Chung | H01L 24/06 |
| | | | 438/597 |
| 2008/0122082 A1 * | 5/2008 | Yamamoto | H01L 24/10 |
| | | | 257/737 |
| 2010/0072635 A1 * | 3/2010 | Kuo | H01L 24/13 |
| | | | 257/797 |
| 2013/0015587 A1 * | 1/2013 | Okutsu | H01L 23/522 |
| | | | 257/774 |
| 2013/0134542 A1 * | 5/2013 | Lu | H01L 31/028 |
| | | | 257/437 |
| 2018/0083100 A1 | 3/2018 | Mizuhara et al. | |

* cited by examiner

SEMICONDUCTOR DEVICE AND SEMICONDUCTOR PACKAGE COMPRISING THE SAME

PRIORITY STATEMENT

This U.S. non-provisional application claims priority under 35 U.S.C § 119 to Korean Patent Application No. 10-2018-0091643 filed on Aug. 7, 2018 in the Korean Intellectual Property Office, the contents of which are hereby incorporated by reference in their entirety.

BACKGROUND

1. Field of the Inventive Concept

The present inventive concept relates to a semiconductor device and to a semiconductor package including the same.

2. Description of the Related Art

Semiconductor devices are constantly being improved to reduce their size and increase their level of performance. In this respect, a low dielectric constant insulating film has been used to offer one improvement in semiconductor devices.

Semiconductor devices may be manufactured at a wafer level in which plural devices are formed at one time on a substrate, and the substrate may be subsequently cut to separate the devices from one another. Individual ones of the semiconductor devices, in the form of chips, may then be packaged. When cutting the substrate, though, physical stress may be applied to the semiconductor devices. When a low dielectric constant insulating film is used in the semiconductor devices, the stress may give rise to a peeling phenomenon in which a wiring disposed under the low dielectric constant insulating film may peel.

SUMMARY

According to an aspect of the present inventive concept, there is provided a semiconductor device comprising a semiconductor chip region which comprises a semiconductor chip and a first portion of a passivation film covering the semiconductor chip, a scribe line region which comprises a second portion of the passivation film contiguous with the first portion of the passivation film, portions of a first insulating film protruding laterally beyond a distal end of the second portion of the passivation film as viewed in a plan view of the semiconductor device, and a first wiring. The portions of the first insulating film include a first portion disposed alongside the distal end of the second portion of the passivation film as viewed in a plan view of the device, and a second portion protruding laterally outwardly from the first portion of the first insulating film. Also, the first wiring protrudes laterally outwardly from the second portion of the first insulating film as viewed in a plan view of the semiconductor device.

According to another aspect of the present inventive concept, there is provided a semiconductor device having a semiconductor chip region and a scribe line region and comprising a substrate constituting a semiconductor chip, the semiconductor chip disposed in the semiconductor chip region and having semiconductor chip wiring, and the substrate extending into the scribe line region, a first insulating film disposed in the semiconductor chip region and the scribe line region, a first wiring in the scribe line region at an upper portion of the first insulating film, a second insulating film disposed on the first insulating film, the second insulating film having a first region delimiting a first opening exposing the substrate, and a second region delimiting a second opening exposing the first wiring, and a passivation film disposed on the second insulating film. The passivation film exposes both the first region of the second insulating film and the second region of the second insulating film, and a width of the first region of the first insulating film being less than a width of the second region of the second insulating film.

According to another aspect of the present inventive concept, there is provided a semiconductor device comprising a substrate, an integrated circuit component in the substrate, a lower wiring structure disposed on the substrate, an upper wiring structure disposed on the lower insulating wiring structure, a passivation layer disposed on the upper wiring structure, and a connection terminal disposed at an upper surface of the passivation layer and electrically connected to the redistribution wiring of the upper wiring structure. The lower wiring structure includes a lower insulating layer and wiring extending through the lower insulating layer and electrically connected to the integrated circuit component, the wiring including a conductive wiring element disposed at an outer peripheral portion of an upper surface of the lower insulating structure. The upper wiring structure includes an upper insulating layer having a first region at one side thereof and a tab protruding from the first region over only part of the conductive wiring element, and redistribution wiring extending through the upper insulating layer and electrically connected to the wiring of the lower wiring structure.

According to still other aspects of the present inventive concept, there is provided a semiconductor package having a semiconductor device, according to any of the aspects above, mounted on and electrically connected to a semiconductor package substrate.

BRIEF DESCRIPTION OF THE DRAWINGS

The above and other aspects and features of the present inventive concept will become more apparent from the following detailed description of examples thereof made with reference to the attached drawings, in which.

DETAILED DESCRIPTION

Hereinafter, an example of a semiconductor device and a semiconductor package including the same according to the present inventive concept will be described with reference to FIGS. 1A, 1B, and 2 to 5.

Figure 1A:
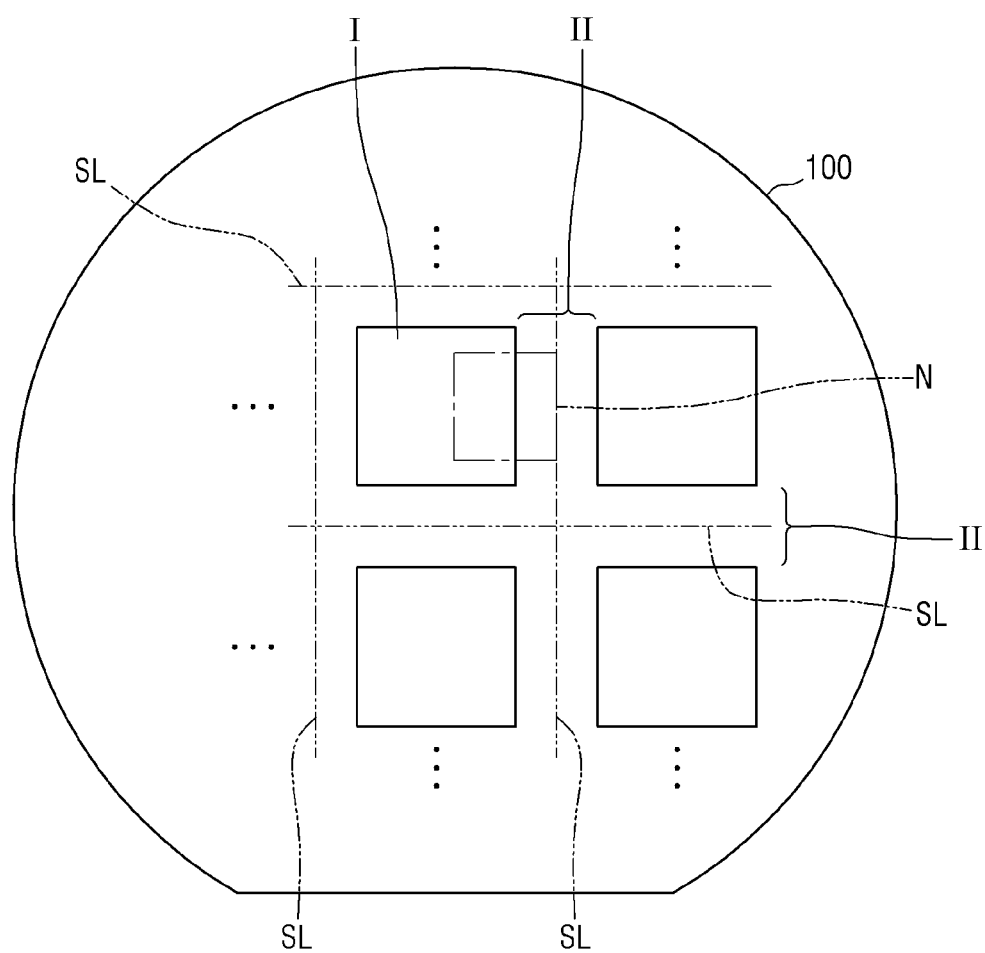
FIG. 1A is a plan view of a substrate on which semiconductor devices according to the present inventive concept are integrated.
Figure 1B:
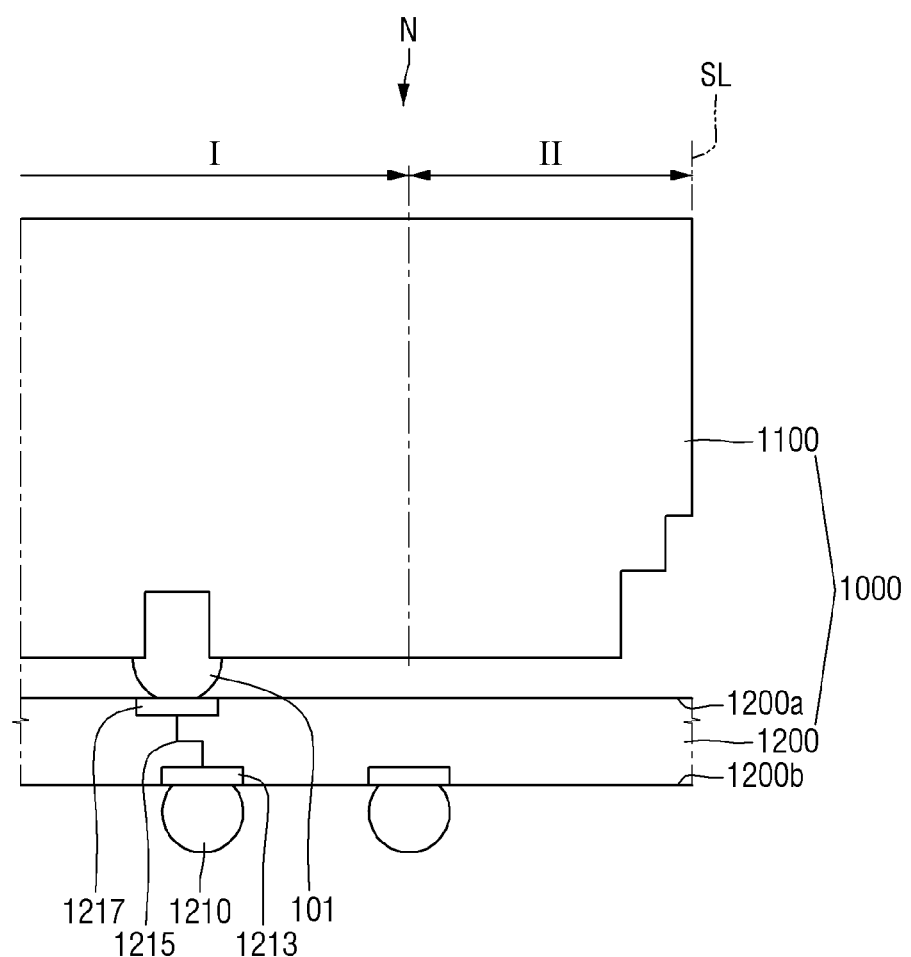
FIG. 1B is a cross-sectional view of part of an example of a semiconductor package according to the present inventive concept.
Figure 2:
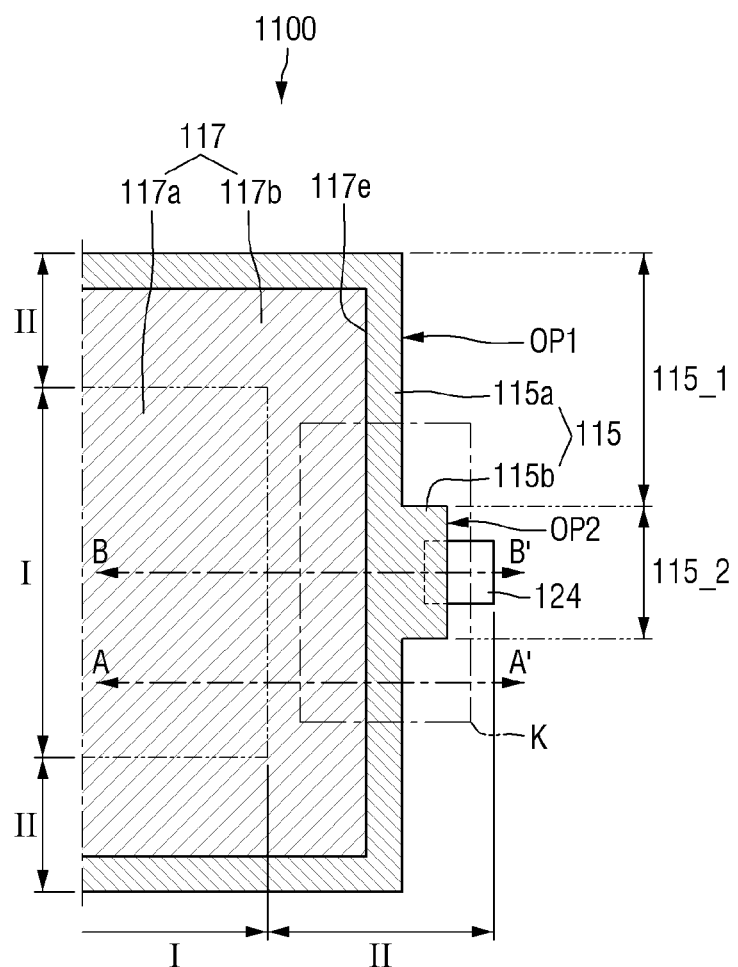
FIG. 2 is a bottom view of part of a semiconductor device of the package illustrated in FIG. 1B.
Figure 3:
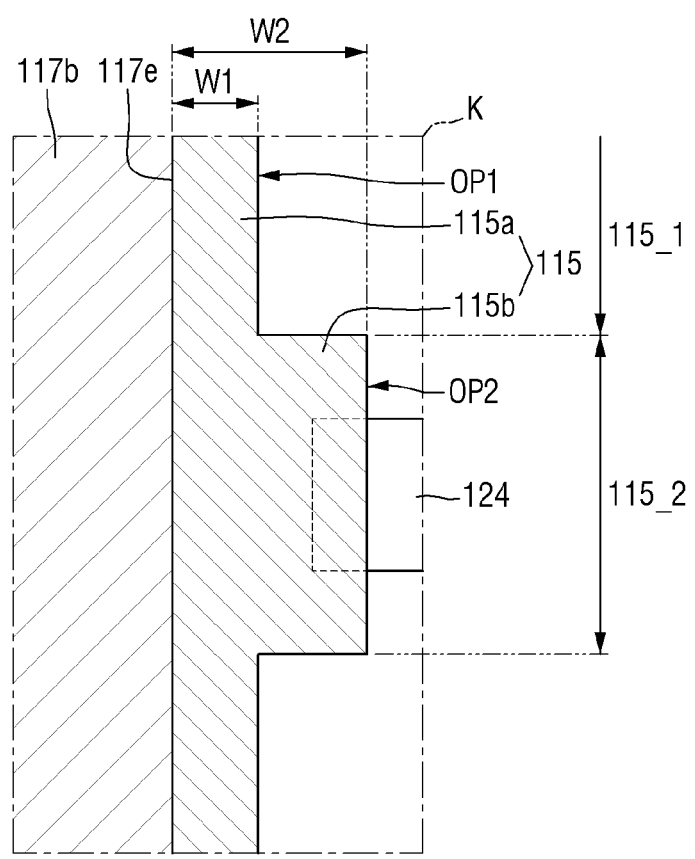
FIG. 3 is an enlarged view of region K of FIG. 2.
Figure 4:
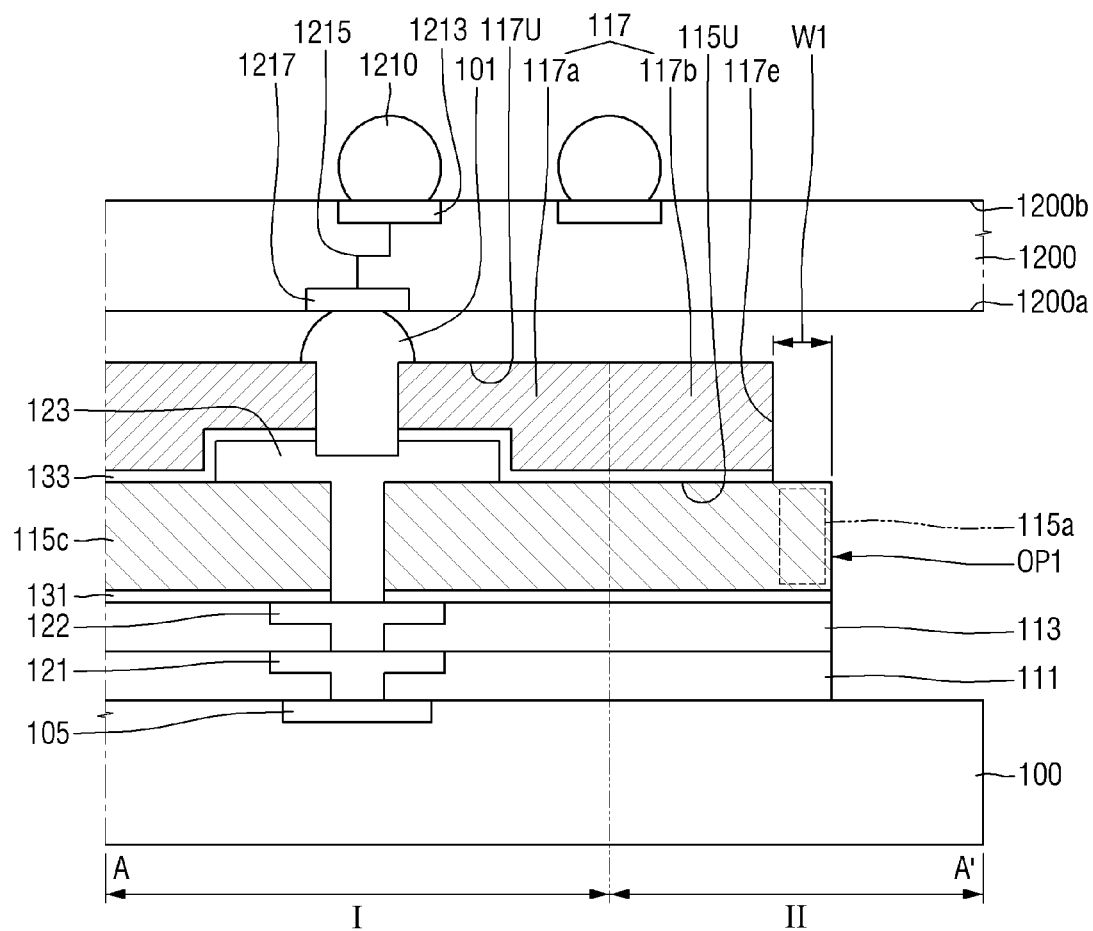
FIG. 4 is a cross-sectional view taken along line A-A' of FIG. 2.

FIG. 1A illustrates a substrate 100 on which semiconductor devices 1100 are integrated, i.e., before the substrate 100 is cut to separate the semiconductor devices 1100 from each other. FIG. 1B illustrates a semiconductor package 1000 comprising one of the semiconductor devices 1100, according to the present inventive concept. In particular, FIG. 1B is an enlarged view of region N of FIG. 1A after the substrate 100 of FIG. 1A is cut along a cutting line SL to separate the semiconductor devices from each other and one of the semiconductor devices is mounted on a semiconductor package substrate 1200. In FIG. 1B, a molding material and the like are not illustrated for clarity of illustration. FIG. 2 is a bottom view of the semiconductor device 1100 of FIG. 1B but for purposes of description shows features in a plan view when the device 1000 is inverted with respect to the orientation shown in FIG. 1B (as shown in FIG. 4). In FIG. 2, only a passivation film 117, a third insulating film 115a and a first wiring element 124 are illustrated for clarity. FIG. 3 is an enlarged view of region K of FIG. 2. FIG. 4 is a cross-sectional view taken along line A-A' of FIG. 2. FIG. 5a is a cross-sectional view taken along line B-B' of FIG. 2.

Also, note, the ordinals "first", "second", etc. are used to simply discriminate similar elements or features, e.g., insulating films, from one another in the order in which they are mentioned and are not limiting. Therefore, an insulating film termed a "third" insulating film in one place in this disclosure may be termed otherwise, e.g., as a "first" or a "second" insulating film, in another place in this disclosure such as the claims.

Referring to FIG. 1A, the substrate 100 may include a semiconductor chip region I and a scribe line region II. A plurality of semiconductor chip regions I may be disposed on the substrate 100. Each of the plurality of semiconductor chip regions I may be spaced apart from each other by the scribe line region II.

The semiconductor chip region I may include a semiconductor chip wiring (105a of FIG. 4), a lower wiring structure (121 of FIG. 4), an upper wiring structure (122 of FIG. 4) and a rewiring layer (123 of FIG. 4).

The scribe line region II may include a cutting line SL. The cutting line SL may be a virtual line along which the substrate 100 is cut to singulate devices one of which is the semiconductor device 1100 described with reference to FIGS. 1B and 2.

The semiconductor device 1100 formed by cutting the substrate 100 along the cutting line SL may include a part of the semiconductor chip region I and a part of the scribe line region II.

Referring to FIG. 1B, the semiconductor package 1000 according to the present inventive concept may include the semiconductor package substrate 1200 and the semiconductor device 1100.

The semiconductor package substrate 1200 may be, for example, a printed circuit board (PCB) or a ceramic substrate. The semiconductor package substrate 1200 may include a first surface 1200a and a second surface 1200b.

The first surface 1200a and the second surface 1200b of the semiconductor package substrate 1200 may face each other. The semiconductor device 1100 may be mounted on the first surface 1200a of the semiconductor package substrate 1200. A plurality of external connection terminals 1210 may be attached to the second surface 1200b of the semiconductor package substrate 1200.

The semiconductor package substrate 1200 and the semiconductor device 1100 may be electrically connected to each other via a connection terminal 101. The connection terminal 101 may be interposed between the first surface 1200a of the semiconductor package substrate 1200 and the semiconductor device 1100. A plurality of connection terminals 101 may electrically connect the semiconductor package substrate 1200 and the semiconductor device 1100.

The external connection terminals 1210 may electrically connect the semiconductor package 1000 to an external device.

The connection terminal 101 and the external connection terminal 1210 may be a conductive ball or a solder ball, but the present inventive concept is not limited thereto. The connection terminal 101 and the external connection terminal 1210 may be, for example, a conductive bump, a conductive spacer or a pin. The plurality of connection terminals 101 or the plurality of external connection terminals 1210 may thus be a ball grid array (BGA) or pin grid array (PGA).

Each external connection terminal 1210 and a respective connection terminal 101 may be electrically connected to each other via a first pad 1213, a connection wiring 1215a and a second pad 1217.

The first pad 1213 may be disposed at the second surface 1200b of the semiconductor package substrate 1200. The second pad 1217 may be disposed at the first surface 1200a of the semiconductor package substrate 1200. Although the upper surface of the first pad 1213 is illustrated as being located in the same plane as the second surface 1200b of the semiconductor package substrate 1200, the present inventive concept is not limited thereto. In addition, although the upper surface of the second pad 1217 is illustrated as being located in the same plane as the first surface 1200a of the semiconductor package substrate 1200, the present inventive concept is not limited thereto. For example, at least a part of the first pad 1213 may protrude from the bottom surface of the main (insulating) body of the semiconductor package substrate 1200 and/or at least a part of the second pad 1217 may protrude from the upper surface of the main (insulating) body of the semiconductor package substrate 1200.

The first pad 1213 and the second pad 1217 may be electrically connected to each other by the connection wiring 1215.

The first pad 1213, the second pad 1217 and the connection wiring 1215a may include a conductive material.

Referring to FIGS. 2 to 5, the semiconductor device 1100 according to the present inventive concept may have a semiconductor chip region I and a scribe line region II. The semiconductor chip region I and a scribe line region II may correspond to respective parts of the semiconductor chip region I and a scribe line region II described above with reference to FIGS. 1A and 1B.

The semiconductor chip region I may include a semiconductor chip. Furthermore, the semiconductor chip region I may include a first portion 117a of the passivation film 117. The first portion 117a of the passivation film 117 may cover the semiconductor chip. The semiconductor chip may include, in addition to its integrated circuitry formed on substrate 100, a semiconductor chip component 105, lower wiring 121, upper wiring 122 and redistribution wiring 123.

The semiconductor chip may be a memory chip, a logic chip, or the like. In a case in which the semiconductor chip is a logic chip, various types of logic circuits may be used in consideration of the applications of the package and the like. When the semiconductor chip is a memory chip, the memory chip may be a non-volatile memory chip. For example, the memory chip may be a flash memory chip such as a NAND flash memory chip or a NOR flash memory chip. However, the present inventive concept is not limited thereto. The memory chip may be a phase-change random-access memory (PRAM), a magneto-resistive random-access memory (MRAM), or a resistive random-access memory (RRAM).

The scribe line region II may be a region disposed along the periphery of the semiconductor chip region I. The scribe line region II may include a second portion 117b of the passivation film 117, a first portion 115a of the third insulating film 115, a second portion 115b of the third insulating film 115, and a first wiring element 124.

The substrate 100 may have a structure in which a base substrate and an epitaxial layer are stacked, but the present inventive concept is not limited thereto. The substrate 100 may comprise a silicon substrate, a gallium arsenide substrate, a silicon germanium substrate, a ceramic substrate, a quartz substrate, a display glass substrate, or the like, and may be an SOI (silicon or semiconductor on insulator) substrate. Hereinafter, a silicon substrate will be used as an example.

As mentioned above, the substrate 100 may include a semiconductor chip component 105a in the semiconductor chip region I. Here, the semiconductor chip component 105a is shown and described as a metal wiring, e.g., a conductive trace, but the present inventive concept is not limited thereto. The semiconductor chip component 105a may be a transistor, a diode, or a like part of the integrated circuitry formed in the substrate 100, or simply part of such integrated circuitry. For example, the semiconductor chip component 105a may be a gate electrode of the transistor or a source/drain of the transistor.

A first insulating film 111 may be disposed on the substrate 100. The first insulating film 111 may be arranged over the semiconductor chip region I and the scribe line region II. For example, the first insulating film 111 may cover the entire surface of the substrate 100.

The first insulating film 111 may include a low-k dielectric material having a dielectric constant lower than that of a silicon oxide film. The first insulating film 111 may have a dielectric constant of about 1.0 to 3.0 and may include at least one of an organic material, an inorganic material, and an organic-inorganic hybrid material. In addition, the first insulating film 111 may be porous or non-porous. The first insulating film 111 may be formed of, for example, a silicon oxide film-based material doped with impurities or an organic polymer having a low dielectric constant (low-k).

The oxide film-based material doped with impurities may be, for example, fluorine-doped oxide (FSG), carbon-doped oxide, silicon oxide, HSQ (hydrogen silsesquioxane; SiO:H), MSQ (methyl silsesquioxane; SiO:CH$_3$), a-SiOC (SiOC:H) or the like. The organic polymer having a low dielectric constant may be, for example, polyallyl ether resin, cyclic fluororesin, siloxane copolymer, fluorinated polyallyl ether resin, polypentafluorostyrene, polytetrafluorostyrene resin, fluorinated polyimide resin, fluorinated polynaphthalene fluoride, polycide resin, or the like.

In the drawings, the first insulating film 111 is illustrated as a single film, but the present inventive concept is not limited thereto. For example, the first insulating film 111 may include insulating films stacked in a vertical direction, and a barrier film disposed between the insulating films stacked in the vertical direction. The barrier film may include an insulating material such as SiN, SiON, SiC, SiCN, SiOCH film, SiOC, or SiOF.

The lower wiring 121 may be disposed in the first insulating film 111. The lower wiring 121 may be disposed in the semiconductor chip region I. The lower wiring 121 comprises a conductive material.

The lower wiring 121 may be electrically connected to the semiconductor chip wiring 105. The lower wiring 121 may include a lower wiring layer and a lower via interposed between the lower wiring and the semiconductor chip wiring 105. In the drawings, the sides of the lower via are illustrated as having a vertical orientation, but the present inventive concept is not limited thereto. Rather, the sides of the lower via may, of course, extend from the semiconductor chip wiring 105a toward the lower wiring at an arbitrary inclination.

A second insulating film 113 may be disposed on the first insulating film 111. The second insulating film 113 may be disposed over the semiconductor chip region I and the scribe line region II.

The second insulating film 113 may be, for example, a high density plasma (HDP) oxide film.

The upper wiring 122 may be disposed in the second insulating film 113. The upper wiring 122 may be disposed in the semiconductor chip region I.

The upper wiring 122 may electrically connect the redistribution wiring 123 and the lower wiring 121. The upper wiring 122 may include an upper wiring layer and an upper via interposed between the upper wiring and the lower wiring 121. In the drawings, the sides of the upper via are illustrated as having a vertical orientation, but the present inventive concept is not limited thereto. Rather, the sides of the upper via may extend from the lower wiring 121 toward the upper wiring at an arbitrary inclination.

The first wiring element 124 comprises a conductive material. The first wiring element 124 may be disposed in the second insulating film 113 and may be part of the same metallization layer as the upper wiring layer. The first wiring element 124 may be disposed in the scribe line region II. At least a part of the first wiring element 124 may be exposed by the third insulating film 115a and the insertion film 131. The first wiring element 124 may be disposed to protrude from the second portion 115b of the third insulating film 115, i.e., the first wiring element 124 may extend laterally outwardly from the second portion 115b as viewed in a plan view of the device shown in FIGS. 2-5. Here, and in the description that follows, when one element is described as "exposing" another, it will be understood that such a description means that the former element does not cover the latter at all or completely as viewed in a plan view.

The upper wiring 122 comprises a conductive material. The first insulating film 111, the second insulating film 113, the lower wiring 121, the upper wiring 122 and the first wiring element 124 may collectively form a lower wiring (connection) structure.

The insertion film 131 may be disposed on the second insulating film 113. The insertion film 131 may be disposed over the semiconductor chip region I and the scribe line region II. The insertion film 131 may expose at least a part of the upper wiring 122. The insertion film 131 may expose at least a part of the first wiring element 124.

The insertion film 131 may include an insulating material having etching selectivity with respect to the second insulating film 113 and the third insulating film 115. The insertion film 131 may be, for example, a silicon nitride film or a silicon oxynitride film.

The third insulating film 115a may be disposed on the insertion film 131. The third insulating film 115a may be disposed over the semiconductor chip region I and the scribe line region II. The third insulating film 115a has a first region 115_1 delimiting a first opening OP1, and a second region 115_2 delimiting a second opening OP2 is formed. Furthermore, the third insulating film 115a may include a first portion 115a, a second portion 115b, and a third portion 115c. The first region 115_1 of the third insulating film 115a may include only the first portion 115a of the third insulating film 115. The second region 115_2 of the third insulating film 115 may include a part of the first portion 115a of the third insulating film 115a and the second portion 115b.

The first portion 115a of the third insulating film 115a may be disposed in the scribe line region II. The first portion 115a of the third insulating film 115a may protrude from a distal end 117e of the passivation film 117 as viewed in a plan view. The first portion 115a of the third insulating film 115a may be disposed alongside the distal end 117e of the passivation film 117. That is, the first portion 115a of the third insulating film 115a may be that portion of the film disposed along the periphery of the passivation film 117. The first portion 115a of the third insulating film 115a may be that portion of the film which does not overlap the passivation film 117, i.e., no part of the first portion 115a of the third insulating film is vertically juxtaposed with part of the passivation film 117. Thus, the first portion 115a of the third insulating film 115 may be exposed by the passivation film 117.

The second portion 115b of the third insulating film 115a may be in the form of a tab that protrudes from the first portion 115a in the scribe line region II. The second portion 115b of the third insulating film 115a may protrude from the first portion 115a of the third insulating film 115. The second portion 115b of the third insulating film 115a may be exposed by the passivation film 117. The second portion 115b of the third insulating film 115a may also be a portion of the film which does not overlap the passivation film 117. The second portion 115b of the third insulating film 115a may expose the first wiring element 124.

In some examples, an align key is not present on the second portion 115b of the third insulating film 115.

The third portion 115c of the third insulating film 115a may be disposed over the semiconductor chip region I and the scribe line region II. The third portion 115c of the third insulating film 115a may be a portion of the film which is vertically juxtaposed with the passivation film 117.

The third insulating film 115a may include an insulating material different from that of the second insulating film 113. For example, the third insulating film 115a may include TEOS (TetraEthyl Ortho Silicate).

The redistribution wiring 123 may be arranged in the semiconductor chip region I. A part of the redistribution wiring 123 may extend into the third portion 115c of the third insulating film 115a and the insertion film 131. The remaining parts of the redistribution wiring 123 may be disposed on the third portion 115c of the third insulating film 115. The redistribution wiring 123 may be electrically connected to the upper wiring 122. The redistribution wiring 123 may be disposed between the upper wiring 122 and the connection terminal 101.

The third insulating film 115a and the redistribution wiring may together form a redistribution wiring layer and may be referred to as an upper wiring (connection) structure.

The sides of the part of the redistribution wiring 123 extending into third portion 115c of the third insulating film 115a and the insertion film 131 are illustrated as having a vertical orientation, but the present inventive concept is not limited thereto. Rather, the sides may have an arbitrary inclination as extending from the upper wiring 122 toward the passivation film 117.

The redistribution wiring 123 may be formed of at least one metal or a metal alloy selected from the group consisting of copper (Cu), aluminum (Al), nickel (Ni), silver (Ag), gold (Au), platinum (Pt), tin (Sn), lead (Pb), titanium (Ti), chrome (Cr), palladium (Pd), indium (In), zinc (Zn) and carbon (C).

A protective film 133 may be disposed over the semiconductor chip region I and the scribe line region II. The protective film 133 may be disposed on the third portion 115c of the third insulating film 115a and the redistribution wiring 123. The protective film 133 may not extend to the second portion 115b of the third insulating film 115. Thus, the protective film 133 may expose the first portion 115a and the second portion 115b of the third insulating film 115. The protective film 133 may expose a part of the redistribution wiring 123.

The protective film 133 may be, for example, a silicon nitride film or a silicon oxynitride film.

The passivation film 117 may be disposed over the semiconductor chip region I and the scribe line region II. The passivation film 117 may be disposed on the protective film 133.

The passivation film 117 may include a first portion 117a and a second portion 117b. The first portion 117a of the passivation film 117 is that portion of the film disposed in the semiconductor chip region I. The second portion 117b of the passivation film 117 is that portion of the film disposed in the scribe line region II. The second portion 117b of the passivation film 117 may be contiguous with the first portion 117a of the passivation film 117. The second portion 117b of the passivation film 117 may expose the first portion 115a and the second portion 115b of the third insulating film 115.

The distal end 117e of the passivation film 117 may be located on the third insulating film 115. In the drawing, the distal end 117e of the passivation film 117 is illustrated as having a vertical orientation, i.e., as extending vertically from an upper surface 115U of the third insulating film 115, but the present inventive concept is not limited thereto. Rather, the distal end 117e of the passivation film 117 may have an arbitrary inclination.

The passivation film 117 may include a polyimide-based material such as photosensitive polyimide (PSPI).

The upper surface 117U of the passivation film 117 may be located at a level higher than that of the upper surface 115U of the third insulating film 115. In addition, the upper surface 115U of the third insulating film 115 may be disposed at a level higher than that of the upper surface of the first wiring element 124.

The first opening OP1 may be formed in the scribe line region II. The first opening OP1 may be formed in the first region 115_1 of the third insulating film 115.

For example, the sides of the first opening portion OP1 may be defined by surfaces of the first portion 115a of the third insulating film 115, the insertion film 131, the second insulating film 113, and the first insulating film 111. The bottom of the first opening OP1 may be defined by the upper surface of the substrate 100. The first opening OP1 may thus lead to the substrate 100.

In the drawings, the sides of the first opening OP1 are illustrated as vertical with respect to the substrate 100, but the present inventive concept is not limited thereto. Rather, the sides of the first opening OP1 may have an arbitrary inclination.

The second opening OP2 may be formed in the scribe line region II. The second opening OP2 may be delimited by the second region 115_2 of the third insulating film 115.

The sides of the second opening OP2 may be defined by surfaces of the second portion 115b of the third insulating film 115 and the insertion film 131. The bottom of the second opening OP2 may be defined by the upper surface of the first wiring element 124. The second opening OP2 may thus lead to the first wiring element 124.

In the drawings, the sides of the second opening OP2 are illustrated as vertical with respect to the substrate 100, but the present inventive concept is not limited thereto. Rather, the sides of the second opening OP2 may have an arbitrary inclination.

Figure 5:
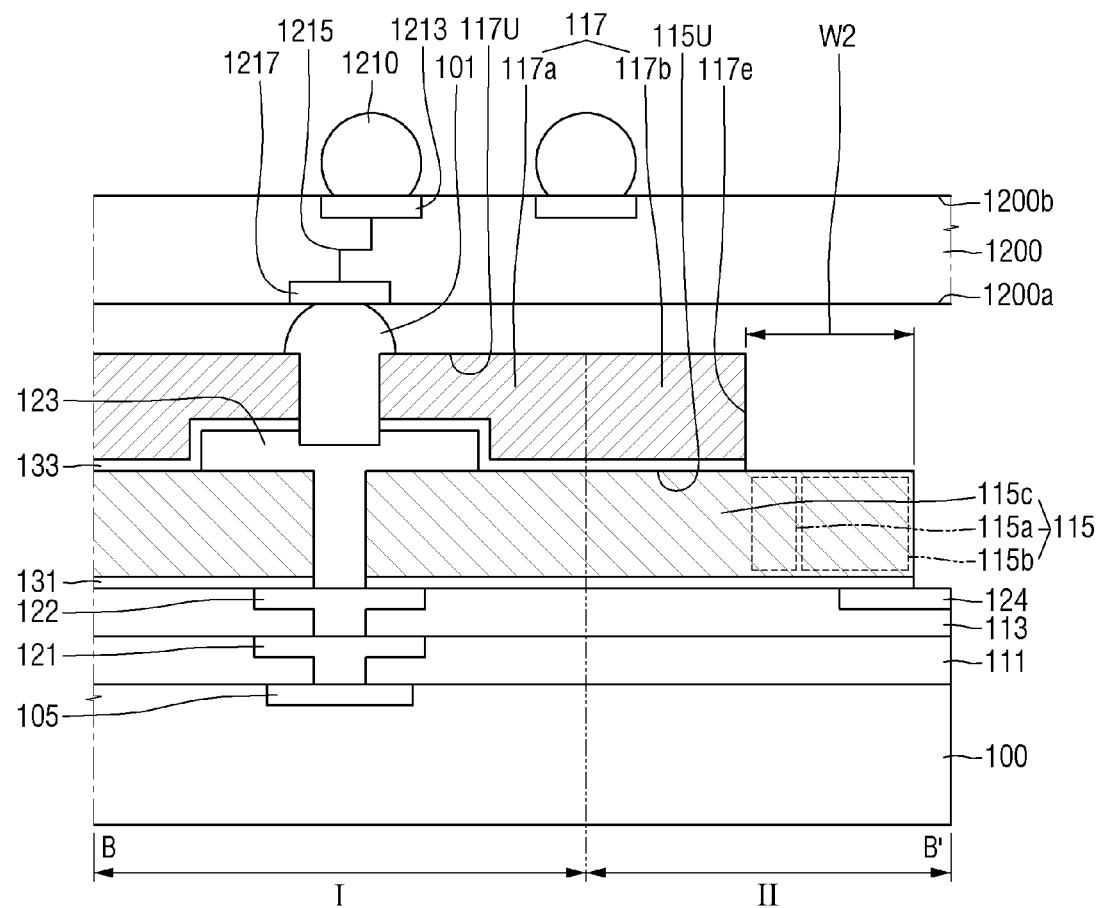
FIG. 5a is a cross-sectional view taken along line B-B' of FIG. 2.

In FIGS. 4 and 5, the bottom of the first opening OP1 may be located at a level below that of the bottom of the second opening OP2. In this respect, a side of the tab (second portion 115b) and an end surface of the first region 115_1 of the third insulating layer 115a delimit a notch in the side of the upper insulating layer, and the notch is an upper part of the opening OP1 that exposes, i.e., leads to, an upper surface of the substrate 100. An end surface of the tab (second portion 115b) delimits a side of the second opening OP2 which exposes, i.e., leads to, part of the first wiring element 124.

A width W1 of the first region 115_1 of the third insulating film 115a may be smaller than a width W2 of the second region 115_2 of the third insulating film 115. The width W1 may be a dimension of the first opening OP1 as measured from the distal end 117e of the passivation film 117 to the side of the first opening OP1. The width W2 may be a dimension of the second opening OP2 as measured from the distal end 117e of the passivation film 117 to the side of the second opening OP2.

Because the second width W2 is larger than the first width W1, a part of the first wiring element 124 is covered with the second portion 115b of the third insulating film 115. In the semiconductor device and the semiconductor package including the semiconductor device according to the present inventive concept, the width of that portion f the third insulating film 115a (that is, the second region 115_2 of the third insulating film 115) in which the first wiring element 124 is disposed is set to be greater than the width of that portion of the third insulating film 115a (that is, the first region 115_1 of the third insulating film 115) in which the first wiring element 124 is not present. Thus, it is possible to prevent a phenomenon in which the first wiring element 124 peels from the second insulating film 113. Accordingly, the yield of the semiconductor device may be improved.

The connection terminal 101 may be disposed in the semiconductor chip region I. A part of the connection terminal 101 may extend into the passivation film 117, the protective film 133 and the redistribution wiring 123. The connection terminal 101 may protrude from the upper surface 117U of the passivation film 117.

The semiconductor chip wiring 105a may be electrically connected to the semiconductor package substrate 1200 through the connection terminal 101.

In the description above, the structure and features of region N of the device as shown in FIGS. 1A and 1B and described in detail with reference to FIG. 2 may be applied to another or more than one side of the semiconductor device 1100. For example, the second portion 115b of the third insulating film 115a may not only be formed in the region N on the one side of the device as shown in FIG. 1A, but in another or at least one other of the sides of the device facing the scribe line SL.

Hereinafter, a method of fabricating a semiconductor device according to the present inventive concept will be described with reference to FIGS. 6 to 13. For the sake of brevity and because semiconductor devices according to the present inventive concept that may be made by the method have already been described above in detail, a description of some of the features of the semiconductor device will be simplified or omitted. For clarity, though, like reference numerals are used to designate like features of the semiconductor devices according to the present inventive concept.

Figure 6:
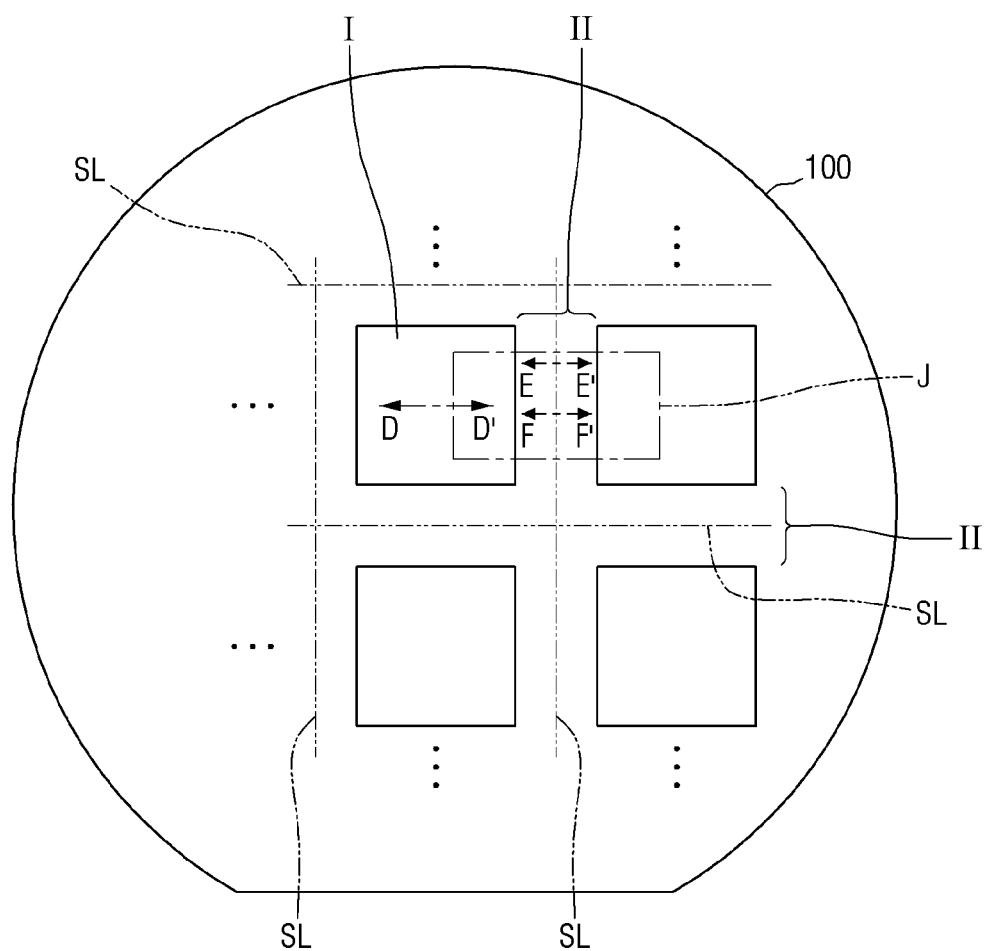
FIG. 6 is a plan view of another substrate on which semiconductor devices according to the present inventive concept are integrated.

FIG. 6 illustrates the substrate 100 on which the semiconductor devices 1100 according to some examples of the present inventive concept are integrated. FIGS. 7 to 11 illustrate intermediate steps in the method of fabricating a semiconductor device according to the present inventive concept. FIGS. 7 to 11 are cross-sectional views taken in directions corresponding to lines D-D', line E-E' and line F-F' of FIG. 6.

Figure 7:
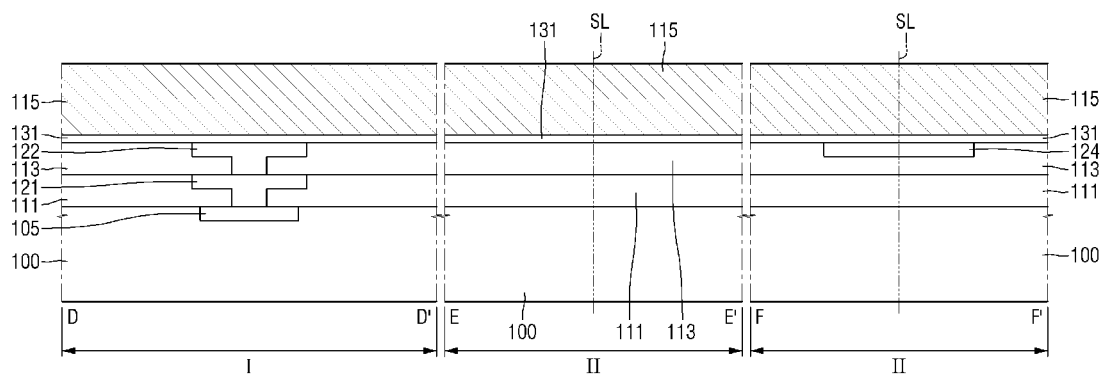
FIGS. 7, 8, 9, 10 and 11 are multi-cross-sectional views, respectively, of a semiconductor device during the course of its manufacture and together illustrate an example of a method of fabricating the semiconductor device according to the present inventive concept.

Referring to FIGS. 6 and 7, a substrate 100 having a semiconductor chip wiring 105 formed thereon may be provided. Furthermore, the first insulating film 111, the second insulating film 113, the insertion film 131, and the third insulating film 115a may be sequentially stacked on the substrate 100. The first insulating film 111, the second insulating film 113, the insertion film 131, and the third insulating film 115a may be formed over the semiconductor chip region I and the scribe line region II.

A lower wiring 121 may be formed on the first insulating film 111. An upper wiring 122 and a first wiring element 124 may be formed on the second insulating film 113.

The lower wiring 121 and the upper wiring 122 may be formed in the semiconductor chip region I. The first wiring element 124 may be formed in the scribe line region II.

Figure 8:
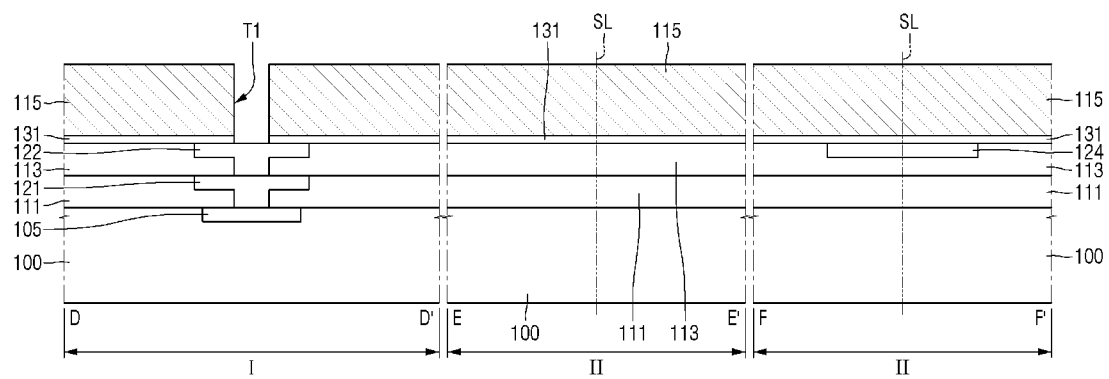

Referring to FIG. 8, a first trench T1 may be formed in the semiconductor chip region I. For example, a part of the third insulating film 115a formed in the semiconductor chip region I, and a part of the insertion film 131 formed in the semiconductor chip region I may be removed. The upper wiring 122 may be exposed by the first trench T1.

Figure 9:
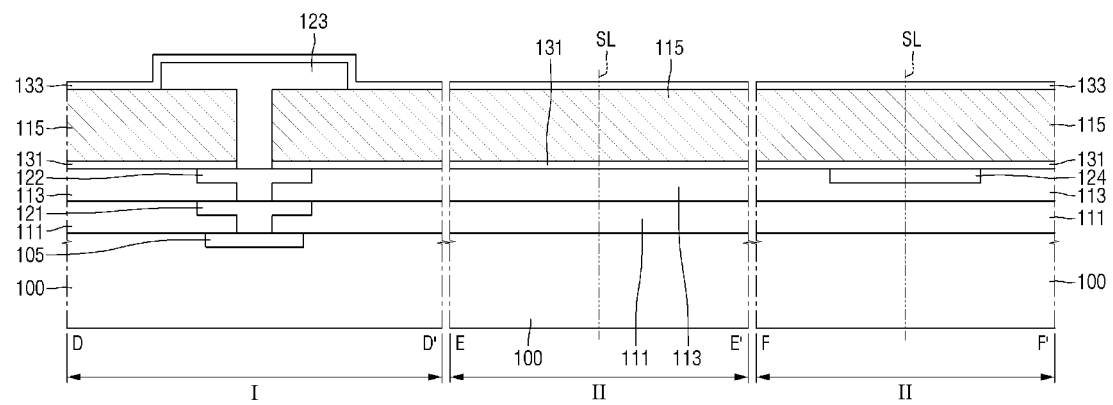

Referring to FIG. 9, a redistribution wiring 123 and a protective film 133 may be formed.

The redistribution wiring 123 may be formed to fill the first trench T1. Furthermore, the redistribution wiring 123 may also be formed on the upper surface of the third insulating film 115. The redistribution wiring 123 may be formed in the semiconductor chip region I.

The protective film 133 may be formed on the third insulating film 115a to cover the redistribution wiring 123. The protective film 133 may be formed over the semiconductor chip region I and the scribe line region II.

Figure 10:
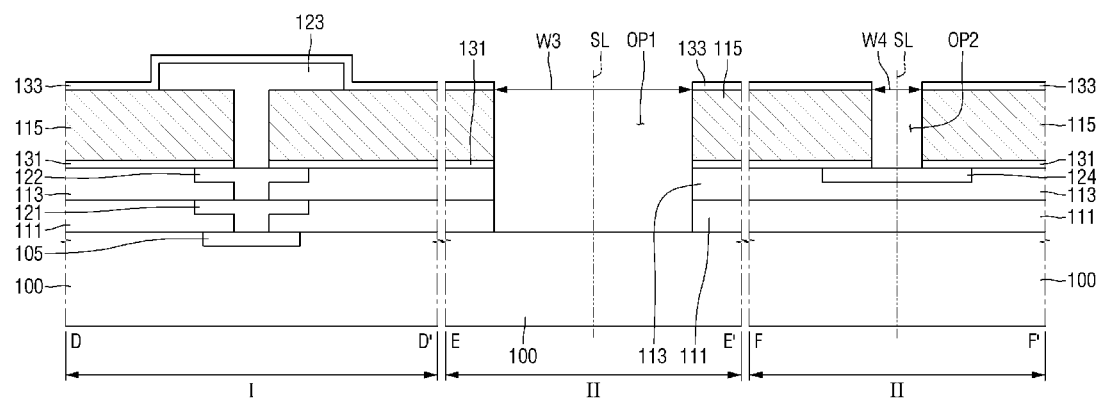

Referring to FIG. 10, a first opening OP1 and a second opening OP2 may be formed in the scribe line region II.

When a part of the protective film 133, a part of the third insulating film 115, a part of the insertion film 131, a part of the second insulating film 113 and a part of the first insulating film 111 which are formed in the scribe line region II are removed, the first opening OP1 may be formed. The first opening OP1 may be formed in that part of the scribe line region II in which the first wiring element 124 is not present. The substrate 100 may be exposed by the first opening OP1.

When a part of the protective film 133, a part of the third insulating film 115, and a part of the insertion film 131 which are formed in the scribe line region II are removed, the second OP2 may be formed. The second opening OP2 may be formed in that part of the scribe line region II in which the first wiring element 124 is formed. The first wiring element 124 may be exposed by the second opening OP2.

A width W3 of the upper part of the first opening OP1 may be greater than a width W4 of an upper part of the second opening OP2. The width W3 of the upper part of the first opening portion OP1 and the width W4 of the upper part of the second opening portion OP2 may be the dimensions measured between opposing boundaries of the structure constituted by the protective film 133 and the third insulating film 115.

Figure 11:
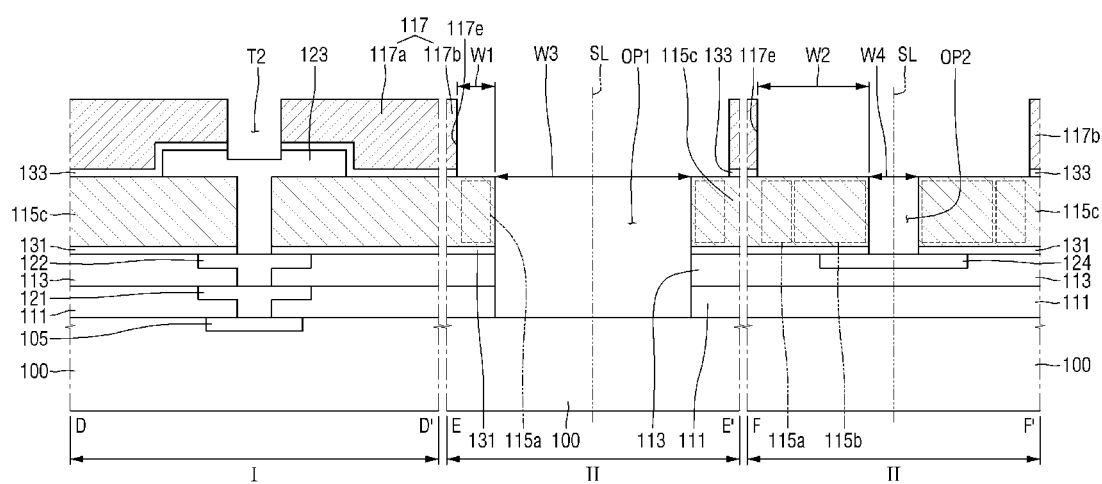

Referring to FIG. 11, the passivation film 117 may be formed on the protective film 133. The passivation film 117 may include a first portion 117*a* and a second portion 117*b*.

A second trench T2 may be formed by removing from the semiconductor chip region I a part of the first portion 117*a* of the passivation film 117, a part of the protective film 133, and a part of the redistribution wiring 123. The second trench T2 may accommodate the connection terminal (101 of FIG. 4) in a subsequent process.

In the course of forming the second portion 117*b* of the passivation film 117, a part of the protective film 133 may be removed. In the course of forming the second portion 117*b* of the passivation film 117, the first portion 115*a*, the second portion 115*b* and the third portion 115*c* of the third insulating film 115*a* may be defined.

For example, referring to FIG. 10, the protective film 133 formed in the scribe line region II covers the entire upper surface of the third insulating film 115. In the course of forming the second portion 117*b* of the passivation film 117, a part of the protective film 133 in the scribe line region II is removed, and a part of the third insulating film 115*a* may be exposed.

When a part of the protective film 133 is removed from the scribe line region II in which the first opening OP1 is formed, the first portion 115*a* of the third insulating film 115*a* may be exposed.

When a part of the protective film 133 is removed in the scribe line region II in which the second opening OP2 is formed, the first portion 115*a* and the second portion 115*b* of the third insulating film 115*a* may be exposed.

The portion of the third insulating film 115*a* which overlaps the first portion 117*a* of the passivation film 117 may be defined as a third portion 115*c* of the third insulating film 115.

Figure 12:
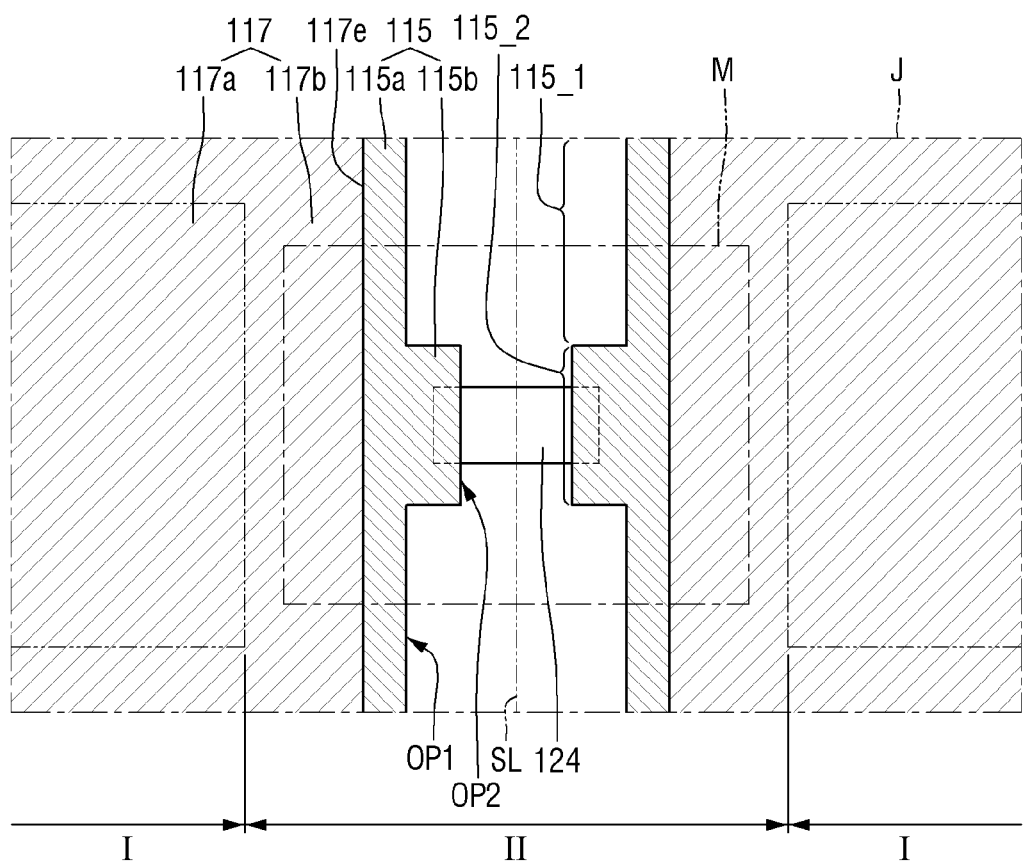
FIG. 12 is an enlarged view of a region J in FIG. 6 after the method of fabricating the semiconductor device of FIGS. 7-11 is performed.
Figure 13:
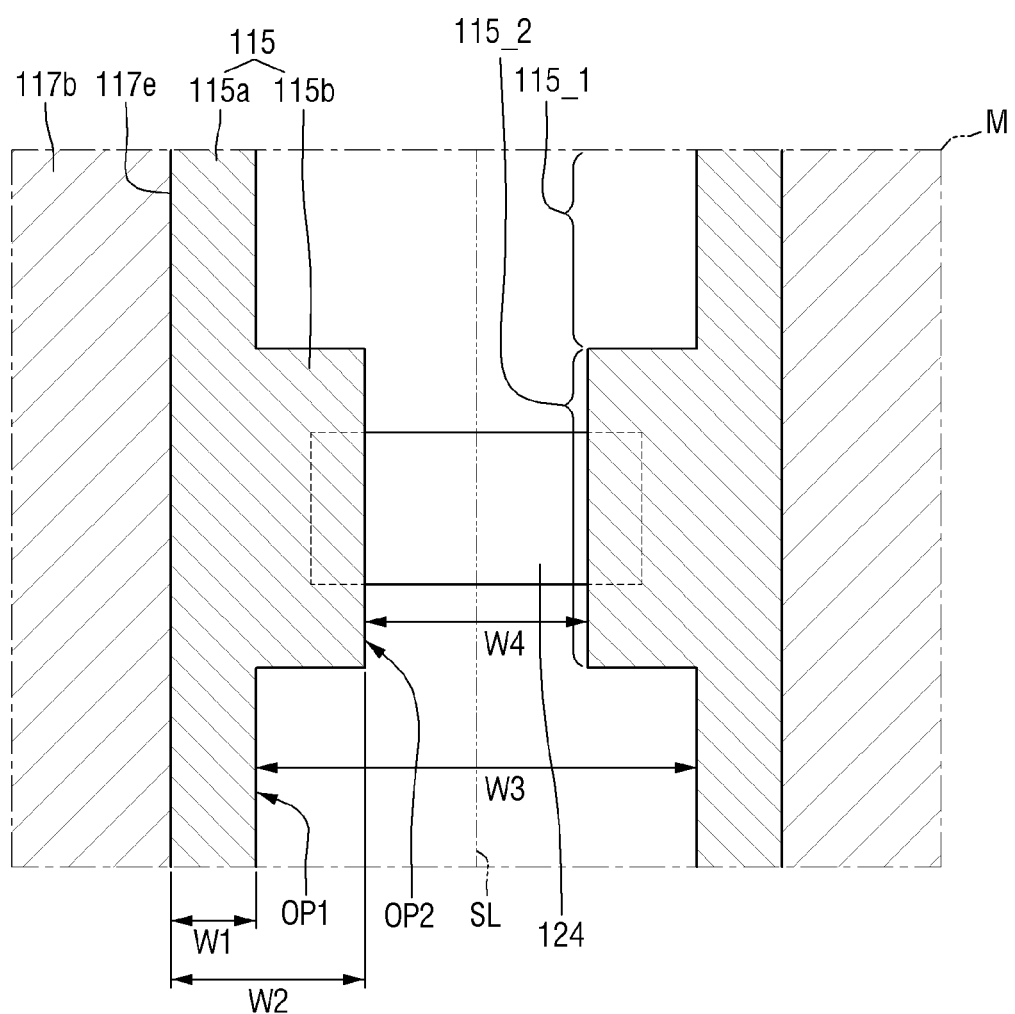
FIG. 13 is an enlarged view of a region M of FIG. 12.

FIG. 12 is an enlarged view of a region J of FIG. 6 after the method of fabricating the semiconductor device of FIG. 11 is performed. FIG. 13 is an enlarged view of a region M of FIG. 12.

Referring to FIGS. 12 and 13, the first opening OP1 may be formed in the first region 115_1 of the third insulating film 115. The second opening OP2 may be formed in the second region 115_2 of the third insulating film 115.

The first width W1 of the first region 115_1 of the third insulating film 115*a* may be smaller than the second width W2 of the second region 115_2 of the third insulating film 115. The width W3 of the upper part of the first opening OP1 may be greater than the width W4 of the upper part of the second opening OP2.

The first wiring element 124 may overlap the second portion 115*b* of the third insulating film 115.

When the substrate 100 is cut along the cutting line SL, examples of semiconductor devices 1100 described with reference to FIG. 2 may be formed.

Although the present inventive concept has been particularly shown and described with reference to various examples thereof, it will be understood by those of ordinary skill in the art that various changes in form and details may be made thereto without departing from the spirit and scope of the present inventive concept as defined by the following claims. It is therefore to be understood that the present examples are to be considered in all respects as illustrative and not restrictive, reference being made to the appended claims rather than the foregoing description to indicate the scope of the inventive concept.

What is claimed is:

1. A semiconductor device comprising:
   a semiconductor chip region which comprises a semiconductor chip and a first portion of a passivation film covering the semiconductor chip;
   a scribe line region which comprises a second portion of the passivation film contiguous with the first portion of the passivation film, portions of a first insulating film protruding laterally beyond a distal end of the second portion of the passivation film as viewed in a plan view of the semiconductor device, and a first wiring,
   wherein the portions of the first insulating film include a first portion disposed alongside the distal end of the second portion of the passivation film as viewed in the plan view of the semiconductor device, and a second portion protruding laterally outwardly from the first portion of the first insulating film, and
   the second portion of the first insulating film exposed by the second portion of the passivation film is on a part of a top uppermost surface of the first wiring, and the first wiring protrudes laterally outwardly from the second portion of the first insulating film as viewed in the plan view of the semiconductor device.

2. The semiconductor device of claim 1, further comprising:
   a substrate in the semiconductor chip region and the scribe line region,
   wherein the first insulating film has a first region delimiting a first opening exposing the substrate, and a second region delimiting a second opening exposing the first wiring.

3. The semiconductor device of claim 2, wherein the first region has a width measured from the distal end of the second portion of the passivation film to a surface defining a proximal side of the first opening, and
   the second region has a width measured from the distal end of the second portion of the passivation film to a surface defining a proximal side of the second opening, and
   the width of the first region is smaller than the width of the second region.

4. The semiconductor device of claim 1, wherein the first wiring, the first insulating film, and the passivation film are sequentially stacked.

5. The semiconductor device of claim 4, wherein the top uppermost surface of the first wiring is located to be lower than an upper surface of the first insulating film, and
   the upper surface of the first insulating film is located to be lower than an upper surface of the passivation film.

6. The semiconductor device of claim 1, wherein the first insulating film has a third portion disposed in the semiconductor chip region and vertically juxtaposed with the first portion of the passivation film, and the semiconductor chip region further comprises:

a rewiring layer at least a part of which is disposed in the third portion of the first insulating film; and a connection terminal electrically connected to the rewiring layer, at least a part of the connection terminal being disposed in the passivation film.

7. The semiconductor device of claim 1, further comprising:

a substrate in the semiconductor chip region and the scribe line region; and a second insulating film on the substrate, the first wiring being disposed at an upper surface of the second insulating film, wherein the passivation film is disposed on the first insulating film, the first insulating film is disposed on the second insulating film, and the first insulating film has a first region delimiting a first opening exposing the substrate, and a second region delimiting a second opening exposing part of the first wiring.

8. The semiconductor device of claim 1, wherein the first insulating film comprises Tetraethyl Ortho Silicate (TEOS).

9. The semiconductor device of claim 1, wherein an align key is not present in the second portion of the first insulating film.

10. The semiconductor device of claim 1, wherein the passivation film comprises a polyimide-based material.

11. A semiconductor package comprising the semiconductor device as claimed in claim 1, and a semiconductor package substrate to which the semiconductor device is mounted.

12. A semiconductor device having a semiconductor chip region and a scribe line region, and comprising:

a substrate constituting a semiconductor chip, the semiconductor chip disposed in the semiconductor chip region and having semiconductor chip wiring, and the substrate extending into the scribe line region;

a first insulating film disposed in the semiconductor chip region and the scribe line region;

a first wiring in the scribe line region at an upper portion of the first insulating film;

a second insulating film disposed on the first insulating film, the second insulating film having a first region delimiting a first opening exposing the substrate, and a second region delimiting a second opening exposing the first wiring; and a passivation film disposed on the second insulating film, wherein the passivation film exposes both the first region of the second insulating film and the second region of the second insulating film, a width of the first region of the second insulating film being less than a width of the second region of the second insulating film, and a part of a top uppermost surface of the first wiring is covered by the second region of the second insulating film exposed by the passivation film.

13. The semiconductor device of claim 12, wherein a distal end of the passivation film is disposed on the second insulating film.

14. The semiconductor device of claim 13, wherein the width of the first region of the second insulating film is a distance between the distal end of the passivation film and a proximal side of the first opening, in a direction parallel to an upper surface of the substrate, and the width of the second region of the second insulating film is a distance between the distal end of the passivation film and a surface of the second region of the second insulating film defining a side of the second opening, in said direction parallel to an upper surface of the substrate.

15. The semiconductor device of claim 14, wherein the proximal side of the first opening is delimited by a surface of the first region of the second insulating film, and the proximal side of the second opening is delimited by a surface of the second region of the second insulating film.

16. The semiconductor device of claim 12, wherein the first wiring protrudes laterally outwardly beyond the second region of the second insulating film as viewed in a plan view of the semiconductor device.

17. The semiconductor device of claim 12, wherein the semiconductor chip region further comprises:

a rewiring layer which is disposed on the first insulating film and at least a part of which is disposed in the second insulating film; and a connection terminal electrically connected to the rewiring layer, at least a part of the connection terminal being disposed in the passivation film.

18. The semiconductor device of claim 12, wherein the first opening and the second opening are confined to the scribe line region.

19. The semiconductor device of claim 12, wherein the first insulating film comprises Tetraethyl Ortho Silicate (TEOS).

20. The semiconductor package of claim 11, wherein the semiconductor package substrate has an electrically conductive pad at a surface thereof, the first insulating film of the semiconductor device has a third portion which is disposed in the semiconductor chip region and is vertically juxtaposed with the first portion of the passivation film, and the semiconductor chip region of the semiconductor device further comprises:

a rewiring layer at least a part of which is disposed in the third portion of the first insulating film; and a connection terminal electrically connected to the rewiring layer and to the electrically conductive pad of the semiconductor package substrate, at least a part of the connection terminal being disposed in the passivation film.

* * * * *